US012782607B2

(12) United States Patent
Park et al.

(10) Patent No.: US 12,782,607 B2
(45) Date of Patent: Nov. 3, 2026

(54) METHOD OF FORMING AMORPHOUS TITANIUM DIOXIDE THIN FILM USING LOW TEMPERATURE ATOMIC LAYER DEPOSITION METHOD AND METHOD OF FABRICATING OPTICAL STRUCTURE

(71) Applicants: SAMSUNG ELECTRONICS CO., LTD., Suwon-si (KR); RESEARCH & BUSINESS FOUNDATION SUNGKYUNKWAN UNIVERSITY, Suwon-si (KR)

(72) Inventors: Hongkyu Park, Yongin-si (KR); Hyunjung Shin, Seoul (KR); Hyoungmin Park, Osan-si (KR); Seokho Yun, Seoul (KR); Minwoo Lim, Suwon-si (KR)

(73) Assignees: SAMSUNG ELECTRONICS CO., LTD., Suwon-si (KR); RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 495 days.

(21) Appl. No.: 18/117,217

(22) Filed: Mar. 3, 2023

(65) Prior Publication Data

US 2023/0280505 A1 Sep. 7, 2023

(30) Foreign Application Priority Data

Mar. 3, 2022 (KR) ........................ 10-2022-0027649

(51) Int. Cl.
*G02B 3/00* (2006.01)
*C23C 16/40* (2006.01)
(Continued)

(52) U.S. Cl.
CPC .......... *G02B 3/0025* (2013.01); *C23C 16/405* (2013.01); *C23C 16/45525* (2013.01);
(Continued)

(58) Field of Classification Search
CPC ........ C23C 16/45527; C23C 16/45525; C23C 16/4412; C23C 16/45502;
(Continued)

(56) References Cited

U.S. PATENT DOCUMENTS 8,426,299 B2 4/2013 Kim et al.
10,795,168 B2 10/2020 Riley, Jr. et al.
(Continued)

FOREIGN PATENT DOCUMENTS

KR 10-2005-0054122 A 6/2005
KR 10-0562669 B1 3/2006
(Continued)

OTHER PUBLICATIONS

Communication dated Mar. 11, 2024, issued by the Korean Intellectual Property Office in Korean Patent Application No. 10-2022-0027649.

*Primary Examiner* — Tabassom Tadayyon Eslami
(74) *Attorney, Agent, or Firm* — Sughrue Mion, PLLC

(57) ABSTRACT

Provided is a method of forming an amorphous titanium dioxide ($TiO_2$) thin film on a substrate using a low temperature atomic layer deposition method, the method of forming an amorphous $TiO_2$ thin film including supplying a titanium (Ti) precursor to the substrate provided in a process chamber to adsorb the Ti precursor on the substrate, forming a Ti precursor film on the substrate by exposing the Ti precursor to the substrate where the Ti precursor is not adsorbed, supplying an oxygen ($O_2$) precursor to the Ti precursor film and reacting the $O_2$ precursor with the Ti precursor film, and forming the $TiO_2$ thin film on the substrate by exposing the
(Continued)

$O_2$ precursor to the Ti precursor film that has not reacted with the $O_2$ precursor, and reacting the Ti precursor film with the $O_2$ precursor.

13 Claims, 20 Drawing Sheets

(51) Int. Cl.

| | |
|---|---|
| ***C23C 16/455*** | (2006.01) |
| ***C23C 16/56*** | (2006.01) |
| ***G02B 1/00*** | (2006.01) |
| ***G02B 1/02*** | (2006.01) |
| ***G03F 7/00*** | (2006.01) |
| ***H04N 23/55*** | (2023.01) |

(52) U.S. Cl.
CPC .............. *C23C 16/56* (2013.01); *G02B 1/002* (2013.01); *G02B 1/02* (2013.01); *G03F 7/70375* (2013.01); *H04N 23/55* (2023.01); *G02B 3/0043* (2013.01)

(58) Field of Classification Search
CPC ........... C23C 16/45557; H10P 14/6339; H10P 14/69215; H01L 21/0228
See application file for complete search history.

(56) References Cited

U.S. PATENT DOCUMENTS

| | | | |
|---|---|---|---|
| 2010/0143710 A1 | 6/2010 | Dickey et al. | |
| 2011/0021033 A1* | 1/2011 | Ikeuchi | C23C 16/402 438/758 |
| 2015/0303054 A1* | 10/2015 | Hanashima | C23C 16/45527 438/758 |
| 2017/0195534 A1 | 7/2017 | Jeong et al. | |
| 2017/0287696 A1* | 10/2017 | Noda | C23C 16/45512 |
| 2019/0064532 A1* | 2/2019 | Riley, Jr. | H01S 5/423 |

FOREIGN PATENT DOCUMENTS

| | | |
|---|---|---|
| KR | 10-2012-0075037 A | 7/2012 |
| KR | 10-1738883 B1 | 5/2017 |
| KR | 10-2292826 B1 | 8/2021 |
| KR | 10-2021-0125226 A | 10/2021 |

* cited by examiner

METHOD OF FORMING AMORPHOUS TITANIUM DIOXIDE THIN FILM USING LOW TEMPERATURE ATOMIC LAYER DEPOSITION METHOD AND METHOD OF FABRICATING OPTICAL STRUCTURE

CROSS-REFERENCE TO RELATED APPLICATION

This application claims priority to Korean Patent Application No. 10-2022-0027649, filed on Mar. 3, 2022, in the Korean Intellectual Property Office, the disclosure of which is incorporated by reference herein in its entirety.

BACKGROUND

1. Field

Example embodiments of the present disclosure relate to a method of forming an amorphous titanium dioxide ($TiO_2$) thin film using a low-temperature atomic layer deposition method and a method of fabricating an optical structure.

2. Description of Related Art

Titanium dioxide ($TiO_2$) is an oxide with a relatively high refractive index and a relatively low dielectric loss, and may be efficiently used for manufacturing an optical structure having a meta surface. The refractive index (n), extinction coefficient, transmittance according to a wavelength band, and the like of $TiO_2$ may vary with the crystallinity of the $TiO_2$. Therefore, $TiO_2$ thin films are widely used for surface optical devices using light of a specific wavelength band, and research and development on a deposition method for $TiO_2$ thin films have been also conducted.

SUMMARY

One or more example embodiments provide a method of forming an amorphous titanium dioxide ($TiO_2$) thin film using a low-temperature atomic layer deposition and a method of fabricating an optical structure.

Additional aspects will be set forth in part in the description which follows and, in part, will be apparent from the description, or may be learned by practice of example embodiments of the disclosure.

According to an aspect of an example embodiment, there is provided a method of forming an amorphous titanium dioxide ($TiO_2$) thin film on a substrate using a low temperature atomic layer deposition method, the method of forming an amorphous $TiO_2$ thin film including supplying a titanium (Ti) precursor to the substrate provided in a process chamber to adsorb the Ti precursor on the substrate, forming a Ti precursor film on the substrate by exposing the Ti precursor to the substrate where the Ti precursor is not adsorbed, supplying an oxygen ($O_2$) precursor to the Ti precursor film and reacting the $O_2$ precursor with the Ti precursor film, and forming the $TiO_2$ thin film on the substrate by exposing the $O_2$ precursor to the Ti precursor film that has not reacted with the $O_2$ precursor, and reacting the Ti precursor film with the $O_2$ precursor.

The low temperature atomic layer deposition method may be performed at a temperature lower than or equal to 200 °C.

The low temperature atomic layer deposition method may be performed at a temperature that is higher than or equal to room temperature and lower than or equal to 100 °C.

The exposing of the Ti precursor may be performed by exposing the Ti precursor in the process chamber to the substrate in a state in which an outlet of the process chamber is closed.

The exposing of the $O_2$ precursor may be performed by exposing the 02 precursor in the process chamber to the Ti precursor film in a state in which an outlet of the process chamber is closed.

According to another aspect of an example embodiment, there is provided a method of fabricating an optical structure, the method including forming, on a substrate, a mold including holes exposing a surface of the substrate, and forming an amorphous titanium dioxide ($TiO_2$) thin film to fill the holes in the mold using a low temperature atomic layer deposition method, wherein the forming of the amorphous $TiO_2$ thin film includes supplying a Ti precursor to the substrate exposed through the holes to adsorb the Ti precursor thereto, forming a Ti precursor film on the substrate by exposing the Ti precursor to the substrate where the Ti precursor is not adsorbed, supplying an $O_2$ precursor to the Ti precursor film and reacting the $O_2$ precursor with the Ti precursor film, and forming the $TiO_2$ thin film on the substrate by exposing the $O_2$ precursor to the Ti precursor film that has not reacted with the $O_2$ precursor and reacting the Ti precursor film with the $O_2$ precursor.

The low temperature atomic layer deposition method may be performed at a temperature lower than or equal to 200 °C The method of fabricating an optical structure may further include performing a planarization process on the $TiO_2$ thin film after forming the $TiO_2$ thin film to fill the holes.

The mold may include an organic material.

The mold may include a photoresist.

The forming of the mold may include forming a photoresist layer on the substrate, and forming the mold including the holes by patterning the photoresist layer through a photolithography process.

The mold may include a spin-on-glass (SOG) material.

The forming of the mold may include sequentially forming an SOG material layer and a photoresist layer on the substrate, patterning the photoresist layer through a photolithography process, and forming the mold including the holes by etching the SOG material layer using the patterned photoresist layer as an etching mask.

The substrate may include an image sensor wafer and a spacer layer provided on the image sensor wafer.

The spacer layer may include at least one of an spin-on-glass (SOG) material and a low temperature oxide (LTO).

According to another aspect of an example embodiment, there is provided an optical structure including a substrate, and a first meta lens array provided on the substrate, wherein the first meta lens array includes a mold including an organic material, and mold having holes formed to expose the substrate, and an amorphous titanium dioxide ($TiO_2$) thin film provided to fill the holes.

The mold may include a photoresist or a spin-on-glass (SOG) material.

The optical structure may further include an image sensor.

The substrate may include an image sensor wafer and a spacer layer provided on the image sensor wafer.

The optical structure may further include a second meta lens array provided on the first meta lens array.

BRIEF DESCRIPTION OF THE DRAWINGS

The above and/or other aspects, features, and advantages of example embodiments of the disclosure will be more apparent from the following description taken in conjunction with the accompanying drawings, in which.

DETAILED DESCRIPTION

Figure 1:
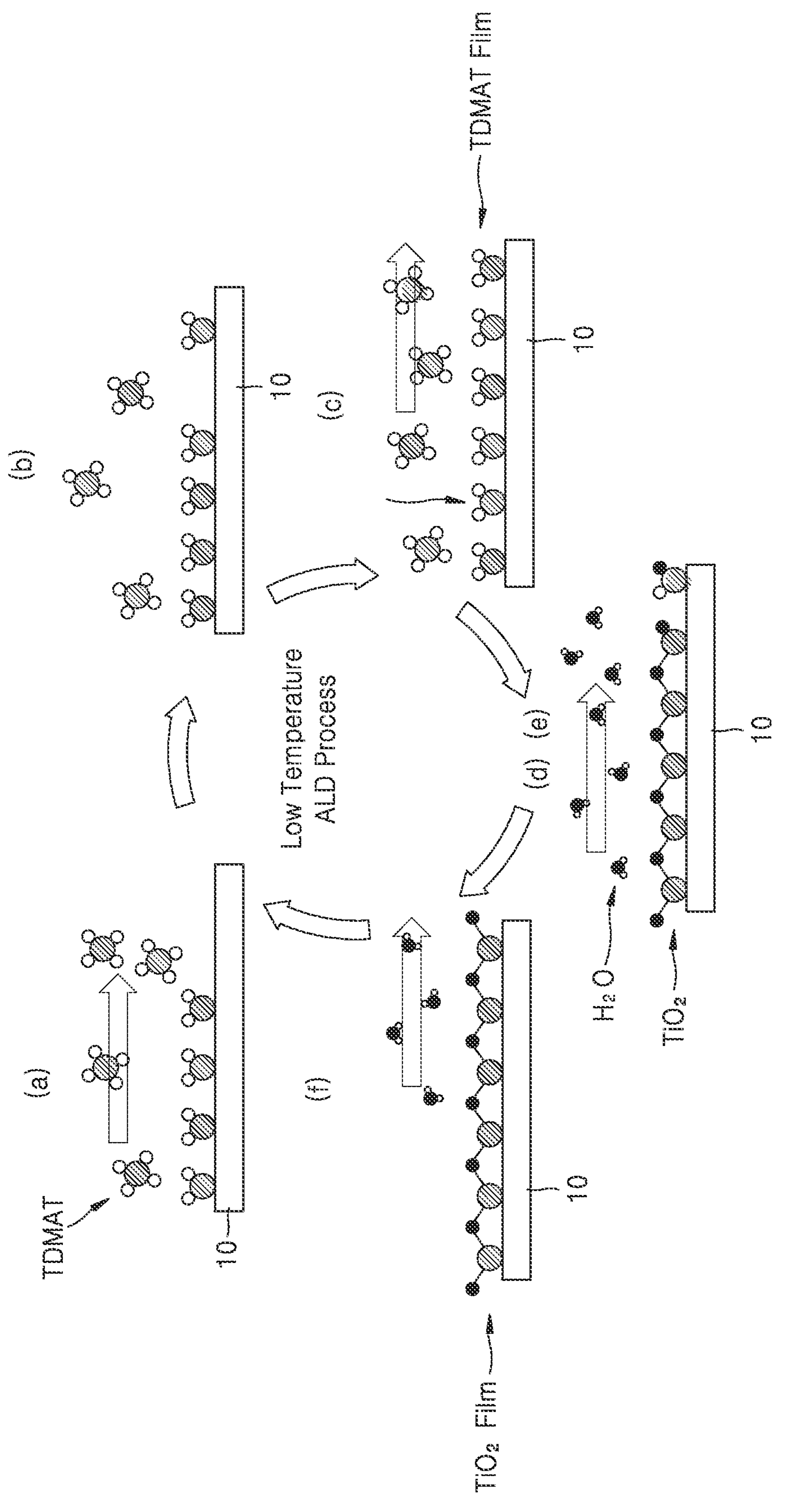
FIG. 1 schematically illustrates a method of forming an amorphous $TiO_2$ thin film using a low temperature atomic layer deposition method according to an example embodiment.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, example embodiments will be described in detail with reference to the accompanying drawings. In the following drawings, the same reference numerals refer to the same components, and the size of each component in the drawings may be exaggerated for clarity and convenience of description. Meanwhile, the embodiments described below are merely exemplary and various modifications are possible from these embodiments.

Hereinafter, the term "upper portion" or "on" may also include "to be present on a non-contact basis" as well as "to be in directly contact with". The singular expression includes plural expressions unless the context clearly implies otherwise. In addition, when a part "includes" a component, this means that it may further include other components, not excluding other components unless otherwise opposed.

The use of the term "the" and similar indicative terms may correspond to both singular and plural. If there is no explicit description of an order for steps that make up a method or vice versa, these steps can be done in an appropriate order and are not necessarily limited to the order described.

Further, the terms "unit", "module" or the like mean a unit that processes at least one function or operation, which may be implemented in hardware or software or implemented in a combination of hardware and software.

The connection or connection members of lines between the components shown in the drawings exemplarily represent functional connection and/or physical or circuit connections, and may be replaceable or represented as various additional functional connections, physical connections, or circuit connections in an actual device.

The use of all examples or exemplary terms is simply to describe technical ideas in detail, and the scope is not limited by these examples or exemplary terms unless the scope is limited by the claims.

A sol-gel method, a physical vapor deposition (PVD), a chemical vapor deposition (CVD), or the like has been used to obtain a crystalline $TiO_2$ thin film. However, the $TiO_2$ thin film deposited in these methods has a polycrystalline phase in which many grains are present instead of a single crystal phase, where the grains have different crystal orientations. Accordingly, the polycrystalline $TiO_2$ thin film has anisotropic refractive characteristics, and uniform optical characteristics may not be obtained depending on the position on the thin film. In addition, the grain boundary of the polycrystalline crystal may have a significant influence on the dielectric loss, resulting in a decrease in the apparent dielectric constant.

In order to improve such degradation characteristics, a method of forming a crystalline $TiO_2$ thin film is required, and in this case, temperature may be an additional limiting factor. In general, a high temperature process of 400 °C or higher is required to obtain a crystalline $TiO_2$ thin film. However, at this high temperature, when a meta-optical structure is to be manufactured on an image sensor wafer provided with an organic material such as a photoresist, a spin-on-glass (SOG) material, and the like, it is nearly impossible to manufacture the meta-optical structure due to the heat-resistant temperature limit of the organic material (e.g., approximately 200 °C or less).

Nanocrystalline deposition using crystalline $TiO_2$ nanocrystals may form a crystalline $TiO_2$ thin film, but the $TiO_2$ thin film formed is a porous thin film and is not suitable for manufacturing a high refractive index thin film due to air present in pores.

In manufacturing the meta-optical structure, it is necessary to secure a uniform deposition rate according to the surface shape. However, when a meta-optical structure is manufactured in a surface shape having a high aspect ratio, the related deposition method described above may cause a local refractive index inhibiting factor such as a void. Accordingly, the performance of the meta-optical structure may be seriously impaired.

Hereinafter, a method of forming a high refractive index amorphous $TiO_2$ thin film using an atomic layer deposition (ALD) performed at a temperature of 200 °C or less and a method of manufacturing an optical structure (e.g., an image sensor) including an organic material will be described.

Figure 2:
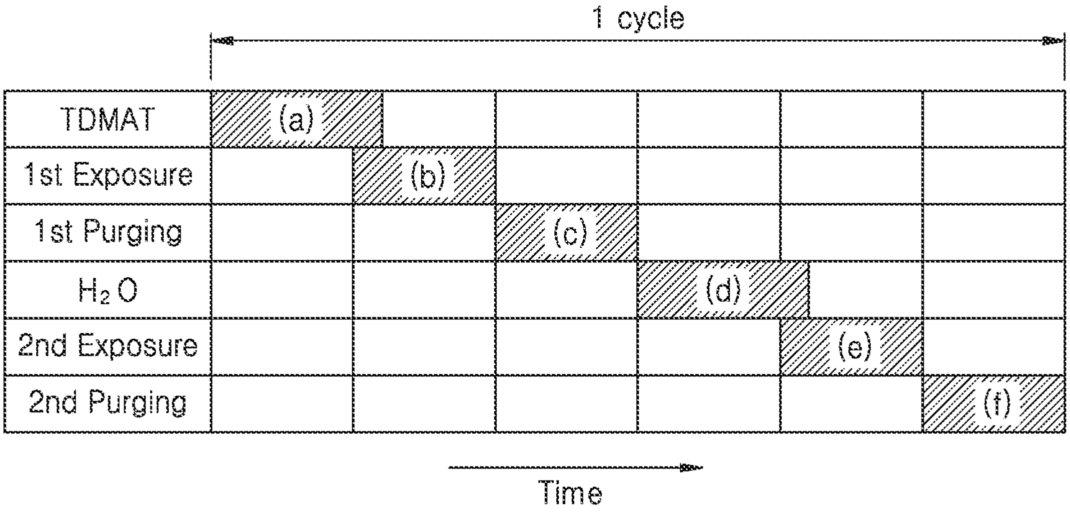
FIG. 2 is a process diagram schematically illustrating a process of forming the amorphous $TiO_2$ thin film illustrated in FIG. 1.

FIG. 1 schematically illustrates a method of forming an amorphous $TiO_2$ thin film using a low temperature atomic layer deposition method according to an example embodiment. FIG. 2 is a process diagram schematically illustrating a process of forming the amorphous $TiO_2$ thin film illustrated in FIG. 1. FIGS. 1 and 2 illustrate a one-cycle process in a low-temperature atomic layer deposition method.

Referring to FIGS. 1 and 2, a substrate 10 for depositing an amorphous $TiO_2$ thin film is first prepared in a process chamber. The internal temperature of the process chamber may be maintained at 200 °C or less. For example, the internal temperature of the process chamber may be maintained at a temperature greater than or equal to room temperature and less than or equal to 100 °C. As the substrate 10, for example, a glass substrate, a silicon substrate, or the like may be used, but embodiments are not limited thereto.

Subsequently, Tetrakis(dimethylamino)titanium (TDMAT), which is a titanium (Ti) precursor, is supplied into the process chamber in operation (a). Here, TDMAT is only an example, and other precursor materials may be used as Ti precursors.

Figure 3A:
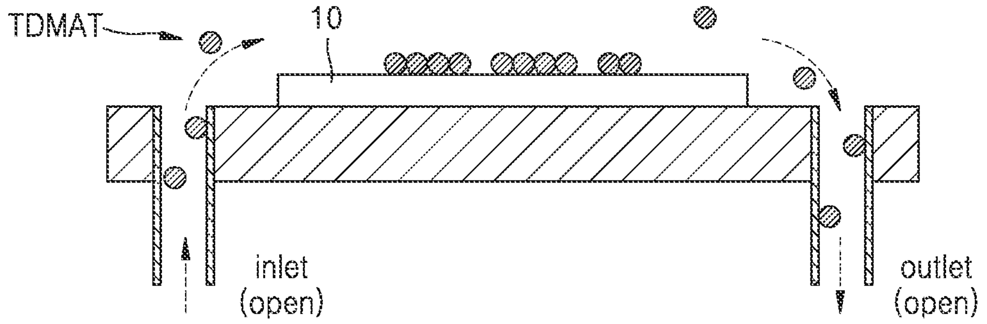
FIGS. 3A and 3B schematically illustrate operations of supplying a TDMAT in a process chamber and exposing the TDMAT to the substrate performed in the process chamber in FIG. 1.

The TDMAT supplied to the inside of the process chamber may form a flow inside the process chamber. FIG. 3A illustrates an operation in which TDMAT is supplied to flow through the process chamber (operation (a) of FIGS. 1 and 2). Referring to FIG. 3A, TDMAT is introduced into the process chamber through the inlet of the process chamber, and the TDMAT inside the process chamber is discharged to the outside through the outlet of the process chamber. Accordingly, the TDMAT forms a flow from the inlet to the outlet inside the process chamber.

In this way, when TDMAT is supplied to the inside of the process chamber, the TDMAT may be chemically or physically adsorbed on the surface of the substrate 10. In this process, since the inside of the process chamber is maintained at a relatively low temperature of 200 °C or less, TDMAT may not be adsorbed on a portion of the surface of the substrate 10.

Next, the TDMAT inside the process chamber is exposed to the substrate at the end of the process of supplying the TDMAT to the inside of the process chamber (operation (b) of FIGS. 1 and 2). Here, the exposure process (first exposure process) of TDMAT may partially overlap the supply process of TDMAT, but is not limited thereto.

Figure 3B:
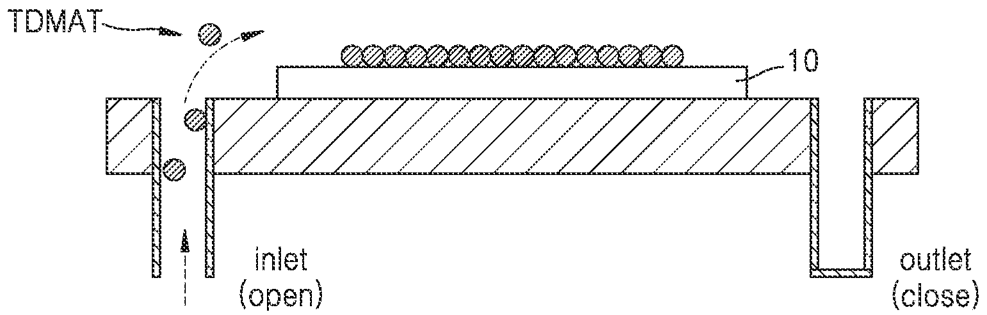

FIG. 3B illustrates an operation in which the TDMAT inside the process chamber is exposed to the substrate (operation (b) of FIGS. 1 and 2). Referring to FIG. 3B, the TDMAT may be introduced through the inlet of the process chamber while the outlet of the process chamber is closed. In this state, TDMAT present in the process chamber may be adsorbed to the surface of the substrate 10 to which the TDMAT has not been adsorbed in operation (a). Thereafter, a first purging process is performed inside the process chamber using an inert gas to form a TDMAT film on the entire surface of the substrate (operation (c) of FIGS. 1 and 2).

Subsequently, water ($H_2O$), which is an oxygen ($O_2$) precursor, is supplied into the process chamber (operation (d) of FIGS. 1 and 2). Here, $H_2O$ is only exemplary, and other precursor materials may be used as the $O_2$ precursor.

The $H_2O$ supplied to the inside of the process chamber may form a flow inside the process chamber. For example, $H_2O$ flows into the process chamber through the inlet of the process chamber, and $H_2O$ inside the process chamber is discharged to the outside through the outlet of the process chamber. Accordingly, the $H_2O$ forms a flow from the inlet to the outlet inside the process chamber.

The $H_2O$ supplied into the process chamber may react with the TDMAT film adsorbed on the surface of the substrate 10 to thereby form $TiO_2$. In this process, since the inside of the process chamber is maintained at a relatively low temperature of 200 °C or less, a portion of the TDMAT film may not react with $H_2O$.

Next, the $H_2O$ inside the process chamber is exposed to the TDMAT film at the end of the process of supplying the $H_2O$ to the inside of the process chamber (operation (e) of FIGS. 1 and 2). Here, the exposure process (secondary exposure process) of the $H_2O$ may partially overlap the supply process of the $H_2O$, but embodiments are not necessarily limited thereto.

In the process of exposing $H_2O$, $H_2O$ may be introduced through the inlet of the process chamber while the outlet of the process chamber is closed. In this state, $H_2O$ present in the process chamber may react with the TDMAT film in which $TiO_2$ is not formed in operation (d) described above to thereby form $TiO_2$. Thereafter, a secondary purging process is performed inside the process chamber using an inert gas to form an amorphous $TiO_2$ thin film on the entire surface of the substrate 10 (operation (f) of FIGS. 1 and 2).

The amorphous $TiO_2$ thin film having a high refractive index may be formed on the substrate 10 to a desired thickness by repeatedly performing the processes described above for several to hundreds of cycles.

The thickness of the $TiO_2$ thin film was measured by depositing the $TiO_2$ thin film on a 12-inch wafer using the above-described low temperature atomic layer deposition, and as a result, it was confirmed that the deposited $TiO_2$ thin film had a thickness deviation of about 4% or less. Therefore, it may be seen that the $TiO_2$ thin film was uniformly deposited on the wafer. In addition, it was confirmed that a $TiO_2$ thin film containing no void was formed inside the hole having a diameter of approximately 100 nm to 400 nm and a depth of approximately 600 nm.

Figure 4:
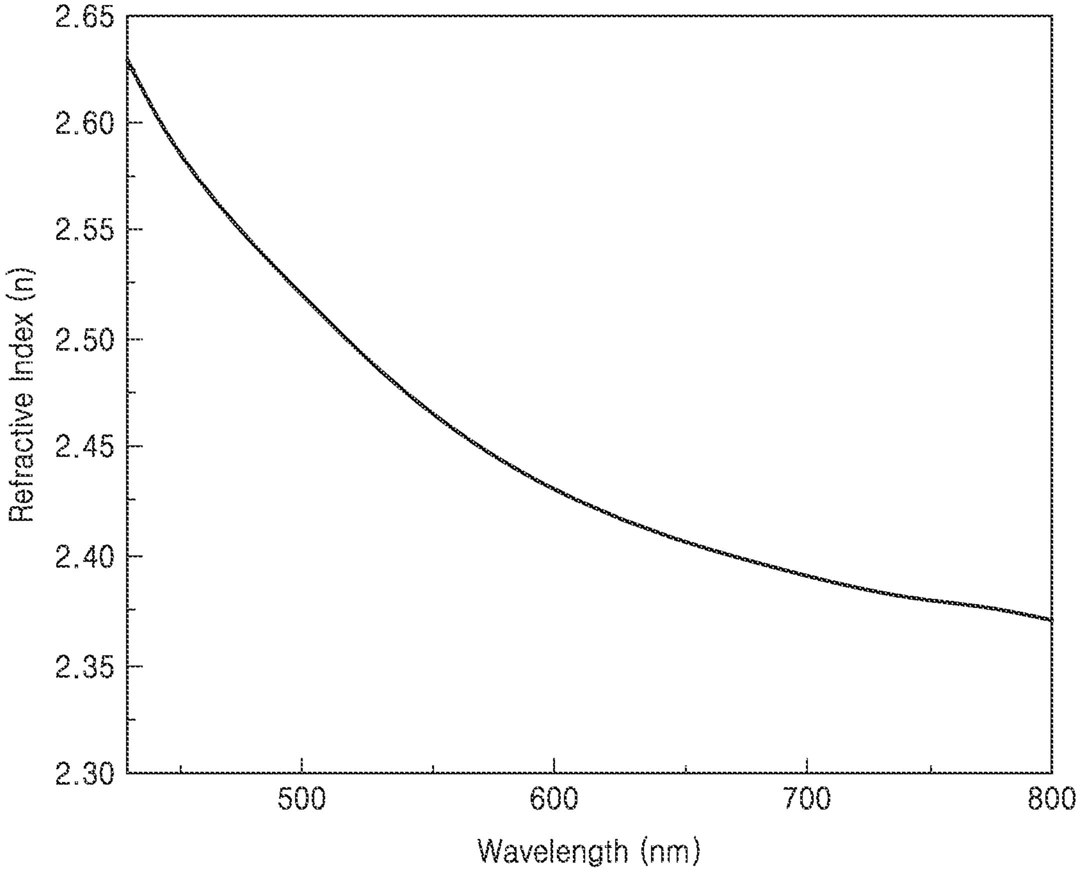
FIG. 4 is a graph illustrating the results of measuring, with an ellipsometer, the refractive index of an amorphous $TiO_2$ thin film formed by a low temperature atomic layer deposition method according to an example embodiment.

FIG. 4 is a graph illustrating the results of measuring, with an ellipsometer, the refractive index of an amorphous $TiO_2$ thin film formed by the above-described low temperature atomic layer deposition method.

Referring to FIG. 4, the refractive index of the wavelength of about 430 nm was measured to be about 2.62, and the refractive index of the wavelength of about 540 nm was measured to be about 2.48. As described above, it may be seen that the amorphous $TiO_2$ thin film formed by the above-described low temperature atomic layer deposition method has a high refractive index suitable for fabricating a meta-optical structure.

Hereinafter, a method of manufacturing an optical structure provided with an amorphous $TiO_2$ thin film with a high refractive index by using the above-described low temperature atomic layer deposition method will be described.

FIGS. 5A to 5E are diagrams illustrating a method of manufacturing an optical structure according to an example embodiment.

Figure 5A:
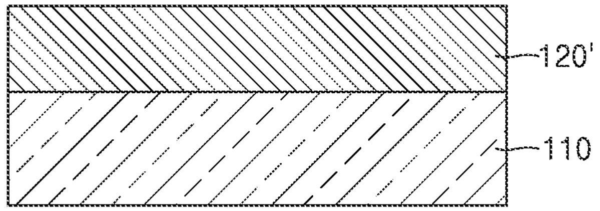
FIGS. 5A, 5B, 5C, 5D, and 5E are diagrams illustrating a method of manufacturing an optical structure according to an example embodiment.
Figure 5B:
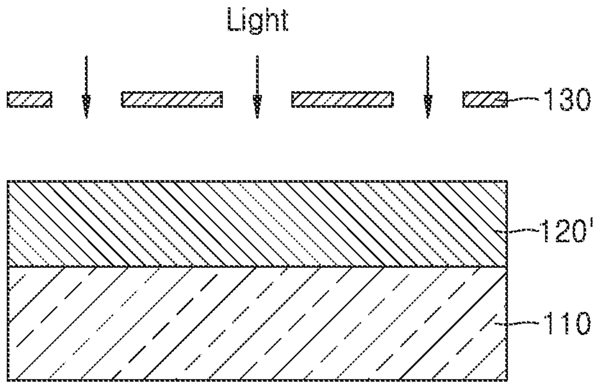

Referring to FIG. 5A, a photoresist layer 120' is formed on a substrate 110. As the substrate 110, for example, a glass substrate or a silicon substrate may be used, but embodiments are not limited thereto. The photoresist layer 120' may include an organic material having a refractive index lower than that of amorphous $TiO_2$ to be described later. For example, the photoresist layer 120' may include an ultraviolet photoresist, an electron beam photoresist, or the like. However, embodiments are not limited thereto.

Figure 5C:
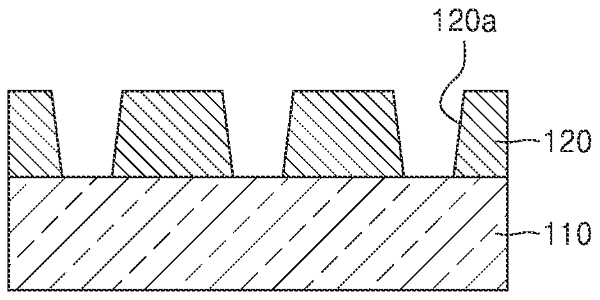

Subsequently, the photoresist layer 120' is patterned by a photolithography process. For example, referring to FIG. 5B, a photomask 130 is provided above the photoresist layer 120', and then light is emitted to the photoresist layer 120' through the photomask 130 to perform an exposure process. Next, when a development process is performed on the exposed photoresist layer 120', a mold 120 may be formed on the substrate 110 as shown in FIG. 5C. Holes 120*a* exposing the upper surface of the substrate 110 are formed in the mold 120.

Figure 5D:
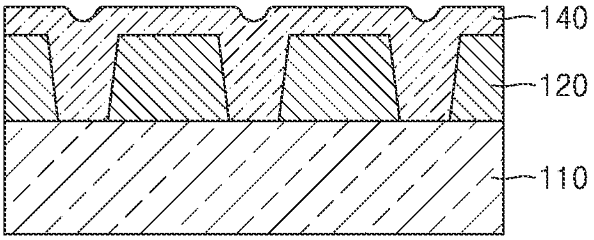

Referring to FIG. 5D, an amorphous $TiO_2$ thin film 140 is formed to cover the mold 120. Here, the $TiO_2$ thin film 140 may be formed using the above-described low-temperature atomic layer deposition method. This will be described below in detail. First, the substrate 110 in which the mold 120 is formed is provided in the process chamber. Here, the internal temperature of the process chamber may be maintained at 200 °C or less. For example, the internal temperature of the process chamber may be maintained at a temperature greater than or equal to room temperature and less than or equal to 100 °C.

Subsequently, a Ti precursor (e.g., TDMAT) is supplied into the process chamber. The Ti precursor supplied to the inside of the process chamber may form a flow inside the process chamber. In this way, when the Ti precursor is supplied to the inside of the process chamber, the Ti precursor may be adsorbed to the surface of the substrate 110 exposed through the holes 120*a* of the mold 120. In this process, since the inside of the process chamber is maintained at a relatively low temperature of 200° C. or less, the Ti precursor may not be adsorbed on a portion of the surface of the substrate 110.

Next, the Ti precursor inside the process chamber is exposed to the substrate 110 at a time point when the supply of the Ti precursor is completed. In this state, the Ti precursor present inside the process chamber may be adsorbed to the surface of the substrate 110 to which the Ti precursor has not been adsorbed even through the supply process of the Ti precursor. Thereafter, a purging process is performed inside the process chamber using an inert gas to form a Ti precursor film on the surface of the substrate 110.

Subsequently, an $O_2$ precursor (e.g., $H_2O$) is supplied into the process chamber. The $O_2$ precursor supplied to the inside of the process chamber may form a flow inside the process chamber. The $O_2$ precursor supplied into the process chamber may react with the Ti precursor film adsorbed on the surface of the substrate 110 to thereby form $TiO_2$. In this process, since the inside of the process chamber is maintained at a relatively low temperature of 200 °C or less, a portion of the Ti precursor film may not react with the $O_2$ precursor.

Next, the $O_2$ precursor inside the process chamber is exposed to the Ti precursor film at a time point when the supply of the $O_2$ precursor is completed. In this state, the $O_2$ precursor present in the process chamber may react with the Ti precursor film in which $TiO_2$ has not been formed through the supply process of the $O_2$ precursor to thereby form $TiO_2$. Thereafter, a purging process is performed inside the process chamber using an inert gas to form an amorphous $TiO_2$ film on the surface of the substrate 110. In addition, by repeatedly performing the processes described above, the amorphous $TiO_2$ thin film 140 with a high refractive index may be formed to cover the mold 120.

Figure 5E:
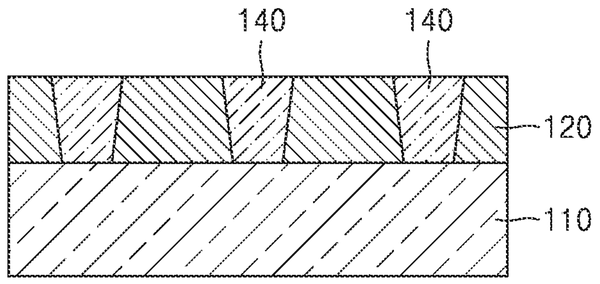

Referring to FIG. 5E, the upper portion of the amorphous $TiO_2$ thin film 140 is planarized using a planarization process such as a chemical mechanical polishing (CMP) process or an etch back process, thereby completing the optical structure. Accordingly, the amorphous $TiO_2$ thin film 140 having a high refractive index may be formed to fill the inside of the holes 120*a* formed in the mold 120.

According to the example embodiment, in manufacturing an optical structure having a meta surface such as meta-prism, an amorphous $TiO_2$ thin film 140 having a high refractive index may be formed in the holes 120*a* of the mold 120 by using the low-temperature atomic layer deposition method which is performed at a temperature of 200 °C or less. Accordingly, an organic material such as a photoresist that is difficult to perform a high-temperature process may be used as the mold 120 in the example embodiment. In addition, since the patterned photoresist layer may be used as the mold 120 through the photolithography process without an etching process, the manufacturing process may also be simplified.

FIGS. 6A to 6E are diagrams illustrating a method of manufacturing an optical structure according to another example embodiment.

Figure 6A:
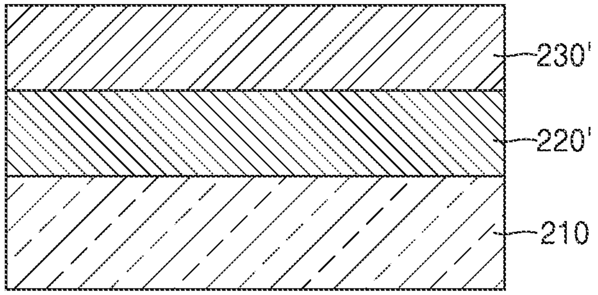
FIGS. 6A, 6B, 6C, 6D, and 6E are diagrams illustrating a method of manufacturing an optical structure according to another example embodiment.
Figure 6B:
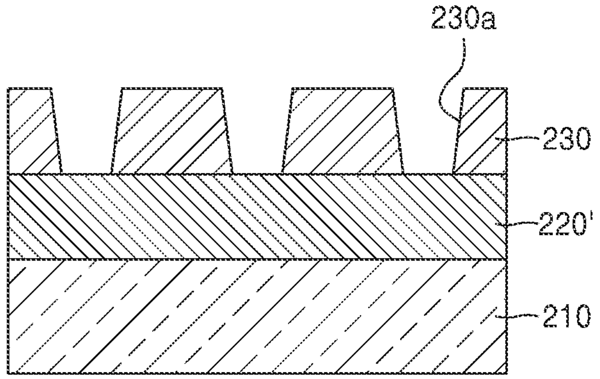

Referring to FIG. 6A, an SOG material layer 220' is formed on a substrate 310. The SOG material layer 220' may include an organic material having a refractive index lower than that of amorphous $TiO_2$ to be described later. Then, a photoresist layer 230' is formed on the SOG material layer 220'. Referring to FIG. 6B, the photoresist layer 230' is patterned using a photolithography process. Since this has been described above, a detailed description thereof will be omitted. Holes 230*a* exposing the top surface of the SOG material layer 220' may be formed in a patterned photoresist layer 230 similar to the photoresist layer 130 in FIG. 5B.

Figure 6C:
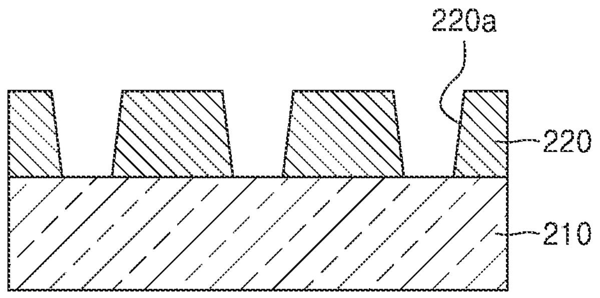

Referring to FIG. 6C, an etching process is performed on the SOG material layer 220' by using the patterned photoresist layer 230 as an etching mask, and then the patterned photoresist layer 230 is removed. Accordingly, a mold 220 in which holes 220*a* exposing the upper surface of the substrate 210 are formed may be formed on the substrate 210.

Figure 6D:
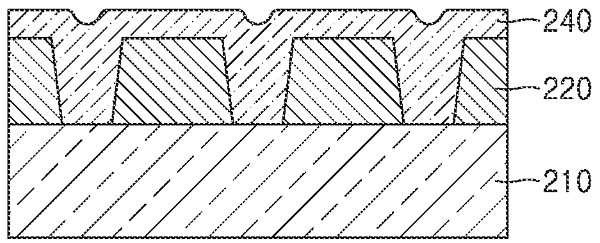
Figure 6E:
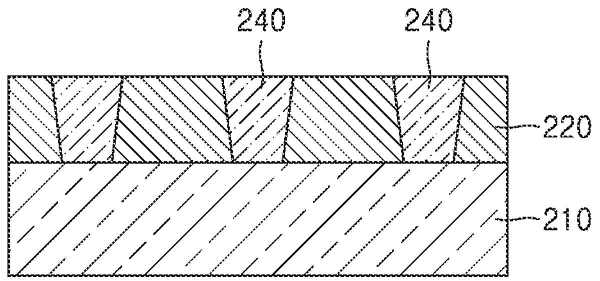

Referring to FIG. 6D, an amorphous $TiO_2$ thin film 240 is formed to cover the mold 220. Here, the amorphous $TiO_2$ thin film 240 may be formed using the above-described low-temperature atomic layer deposition method. Since this has been described above, a detailed description thereof will be omitted. Referring to FIG. 6E, an optical structure is completed by planarizing an upper portion of the amorphous $TiO_2$ thin film 240 using a planarization process. Accordingly, the amorphous $TiO_2$ thin film 240 having a high refractive index may be formed to fill the inside of the holes 220*a* formed in the mold 220.

According to the example embodiment, the amorphous $TiO_2$ thin film 240 having a high refractive index may be formed in the holes 220*a* of the mold 220 by using the low-temperature atomic layer deposition method performed at a temperature of 200 °C or less. Accordingly, an organic material such as the SOG material that is difficult to perform a high-temperature process may be used as the mold 220 in the example embodiment.

Hereinafter, a method of manufacturing an image sensor including a meta lens array as an example of an optical structure will be described.

FIGS. 7A to 7D are diagrams illustrating a method of manufacturing an image sensor according to an example embodiment.

Figure 7A:
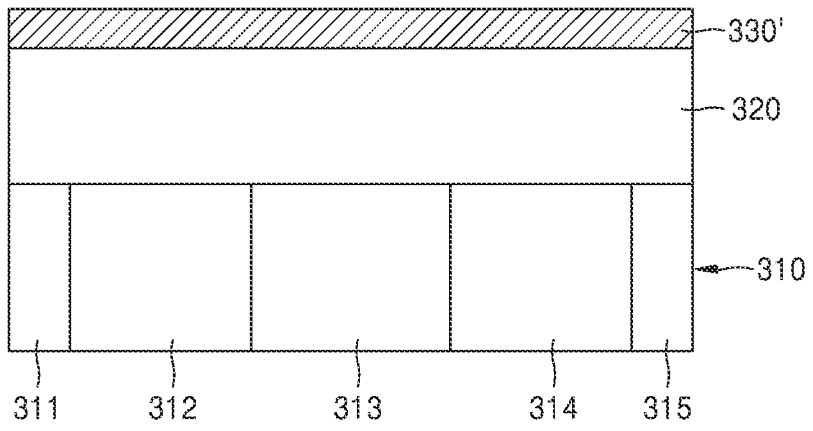
FIGS. 7A, 7B, 7C, and 7D are diagrams illustrating a method of manufacturing an image sensor according to an example embodiment.

Referring to FIG. 7A, a spacer layer 320 is formed on an image sensor wafer 310. Here, the image sensor wafer 310 includes a plurality of pixels 311, 312, 313, 314, and 315 that sense incident light of different wavelengths. The spacer layer 320 may include at least one of, for example, an SOG material and a low temperature oxide (LTO). However, embodiments are not limited thereto. The spacer layer 320 may have a single layer structure or a multilayer structure. As a specific example, the spacer layer 320 may include an SOG material layer provided on the image sensor wafer 310 and an LTC layer provided on the SOG material layer. A photoresist layer 330' is formed on the spacer layer 320. The photoresist layer 330' may include an organic material having a refractive index lower than that of amorphous $TiO_2$ to be described later. An etch stop layer and/or a passivation layer may be additionally provided between the spacer layer 320 and the photoresist layer 330' to prevent loss of the photoresist in a subsequent process.

Figure 7B:
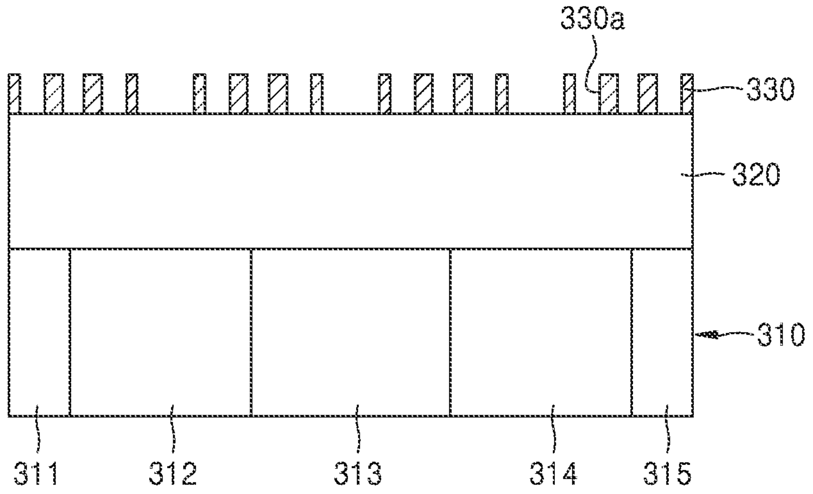

Referring to FIG. 7B, the photoresist layer 330' is patterned using a photolithography process. Since this has been described above, a detailed description thereof will be omitted. Accordingly, a mold 330 including a photoresist may be formed on the spacer layer 320. Holes 330*a* exposing the surface of the spacer layer 320 are formed in the mold 330.

Figure 7C:
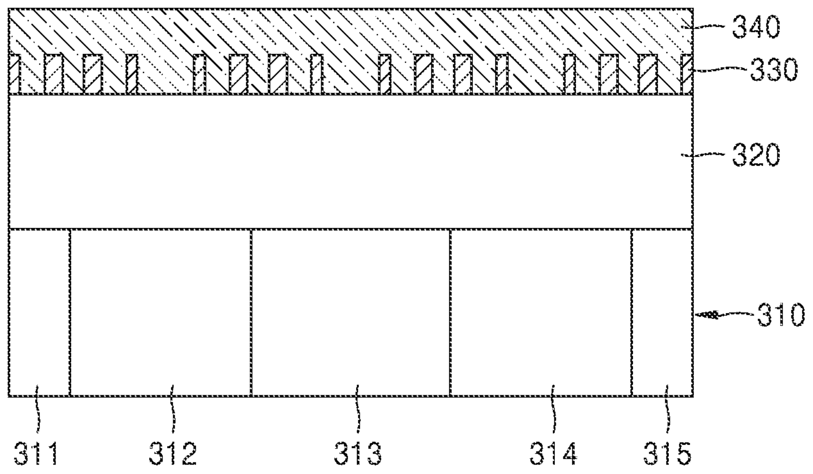

Referring to FIG. 7C, an amorphous $TiO_2$ thin film 340 is formed to cover the mold 330. Here, the amorphous $TiO_2$ thin film 340 may be formed using the above-described low-temperature atomic layer deposition method. Since this has been described above, a detailed description thereof will be omitted.

Figure 7D:
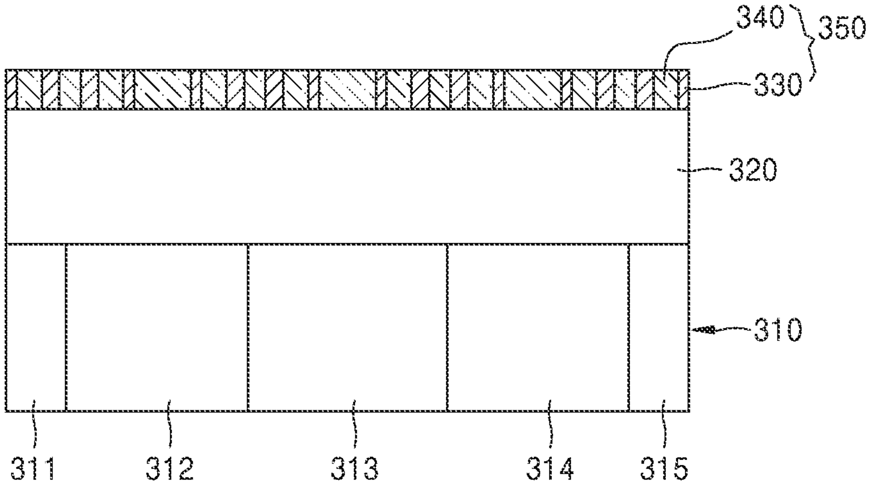

Referring to FIG. 7D, a meta lens array 350 is formed by planarizing an upper part of the amorphous $TiO_2$ thin film 340 using a planarization process. The meta lens array 350 includes the mold 330 including a photoresist and the amorphous $TiO_2$ thin film 340 having a high refractive index filling the holes 330*a* of the mold 330. The meta lens array 350 may include a plurality of meta lenses corresponding to the pixels 311 to 315 of the image sensor wafer 310. Here, the meta lenses may have different nano-patterns, and accordingly, each of the meta lenses may transmit light of a predetermined wavelength to be condensed into a corresponding pixel. More specifically, each of the meta lenses controls the phase of incident light to enable color separation and condensation of pixels for each color wavelength corresponding to each of the pixels 311 to 315. In addition, since the area of each of the meta lenses is designed to be larger than the area of each of the corresponding pixels 311 to 315, the amount of light condensed on each of the pixels is increased. Accordingly, the amount of light condensed for each color to the pixels in a small size may be increased by using the meta lenses. From another point of view, light incident on the meta lenses may be collected in the pixels without passing through the color filters, and thus light loss is reduced, thereby improving light efficiency. In addition, the thickness of the spacer layer 320 may be designed in consideration of the focal length required for the light passing through the meta-lens to be condensed on each of the pixels 311 to 315.

According to the example embodiment, an image sensor may be manufactured using the low-temperature atomic layer deposition method performed at a temperature of 200 °C or less. Here, an organic material such as a photoresist that is difficult to perform a high-temperature process may be used as the mold 330. In addition, since the patterned photoresist layer may be used as the mold 330 through the photolithography process without an etching process, the manufacturing process of the image sensor may also be simplified.

Figure 8:
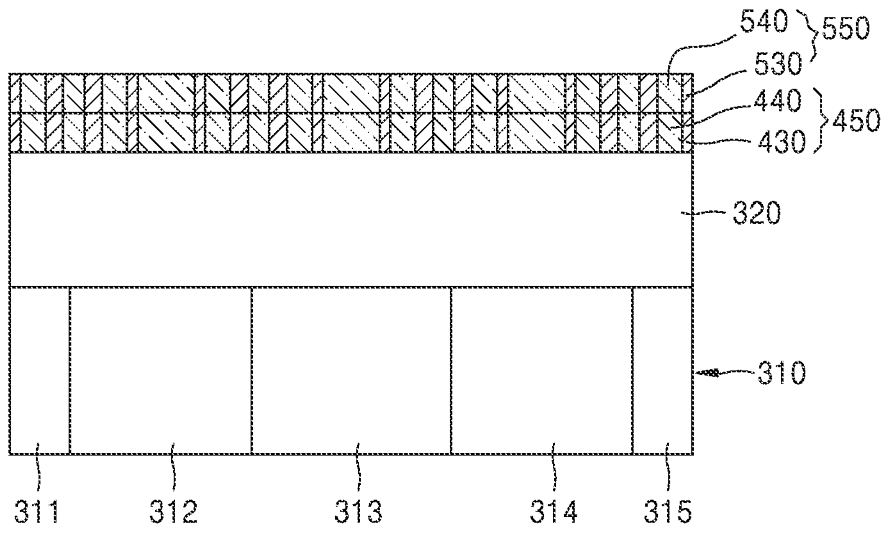
FIG. 8 is a diagram illustrating an image sensor according to another example embodiment.

FIG. 8 a diagram illustrating an image sensor according to another example embodiment.

Referring to FIG. 8, the image sensor includes an image sensor wafer 310, a spacer layer 320 provided on the image sensor wafer 310, and a meta lens array provided on the spacer layer 320. Since the image sensor wafer 310 and the spacer layer 320 have been described above, descriptions thereof will be omitted.

The meta lens array has a multilayer structure. For example, the meta lens array may include a first meta lens array 450 provided on the spacer layer 320 and a second meta lens array 550 provided on the first meta lens array 450.

The first meta lens array 450 may include a first mold 430 including a photoresist and a first amorphous $TiO_2$ thin film 440 provided to fill the holes of the first mold 430. The second meta lens array 550 may include a second mold 530 including a photoresist and a second amorphous $TiO_2$ thin film 540 provided to fill the holes of the second mold 530. The first and second meta lens arrays 450 and 550 may be formed using the above-described low temperature atomic layer deposition method, respectively.

An etching stop layer and/or a passivation layer may be additionally provided between the spacer layer 320 and the first meta lens array 450 and between the first meta lens array 450 and the second meta lens array 550 to prevent loss of photoresist in a subsequent process.

According to the above example embodiment, in manufacturing an optical structure having a meta surface, the high refractive index amorphous $TiO_2$ thin film may be formed in the holes of the mold by using the low-temperature atomic layer deposition method performed at a temperature of 200 °C or less. Accordingly, an organic material such as the photoresist or the spin-on-glass (SOG) material may be used as the mold. In addition, since the patterned photoresist layer may be used as the mold through the photolithography process without an etching process, the manufacturing process may also be simplified.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims and their equivalents.

What is claimed is:

1. A method of forming an amorphous titanium dioxide ($TiO_2$) thin film on a substrate using a low temperature atomic layer deposition method, the method comprising:

supplying a titanium (Ti) precursor to the substrate provided in a process chamber to adsorb the Ti precursor on a first portion the substrate while an outlet of the process chamber is open;

closing the outlet while the Ti precursor is being supplied;

forming a Ti precursor film on the substrate by exposing the Ti precursor to a remaining portion of the substrate where the Ti precursor is not adsorbed and adsorb the Ti precursor on the remaining portion of the substrate while the outlet of the process chamber is closed;

supplying an oxygen ($O_2$) precursor to the Ti precursor film and reacting the $O_2$ precursor with a portion of the Ti precursor film while the outlet of the process chamber is open; and forming the $TiO_2$ thin film on the substrate by exposing the $O_2$ precursor to a remaining portion of the Ti precursor film that has not reacted with the $O_2$ precursor, and reacting the remaining portion of the Ti precursor film with the $O_2$ precursor while the outlet of the process chamber is closed.

2. The method of forming an amorphous $TiO_2$ thin film of claim 1, wherein the low temperature atomic layer deposition method is performed at a temperature lower than or equal to 200 °C.

3. The method of forming an amorphous $TiO_2$ thin film of claim 2, wherein the low temperature atomic layer deposition method is performed at a temperature that is higher than or equal to room temperature and lower than or equal to 100 °C.

4. A method of fabricating an optical structure, the method comprising:

forming, on a substrate, a mold including holes to expose a surface of the substrate; and forming an amorphous titanium dioxide ($TiO_2$) thin film to fill the holes in the mold using a low temperature atomic layer deposition method, wherein the forming of the amorphous $TiO_2$ thin film comprises:

supplying a titanium (Ti) precursor to the substrate provided in a process chamber to adsorb the Ti precursor on a first portion the substrate while an outlet of the process chamber is open;

closing the outlet while the Ti precursor is being supplied;

forming a Ti precursor film on the substrate by exposing the Ti precursor to a remaining portion of the substrate where the Ti precursor is not adsorbed and adsorb the Ti precursor on the remaining portion of the substrate while the outlet of the process chamber is closed;

supplying an oxygen ($O_2$) precursor to the Ti precursor film and reacting the $O_2$ precursor with a portion of the Ti precursor film while the outlet of the process chamber is open; and forming the $TiO_2$ thin film on the substrate by exposing the $O_2$ precursor to a remaining portion of the Ti precursor film that has not reacted with the $O_2$ precursor, and reacting the remaining portion of the Ti precursor film with the $O_2$ precursor while the outlet of the process chamber is closed.

5. The method of fabricating an optical structure of claim 4, wherein the low temperature atomic layer deposition method is performed at a temperature lower than or equal to 200 °C.

6. The method of fabricating an optical structure of claim 4, further comprising performing a planarization process on the $TiO_2$ thin film after forming the $TiO_2$ thin film to fill the holes.

7. The method of fabricating an optical structure of claim 4, wherein the mold comprises an organic material.

8. The method of fabricating an optical structure of claim 7, wherein the mold comprises a photoresist.

9. The method of fabricating an optical structure of claim 8, wherein the forming of the mold comprises:

forming a photoresist layer on the substrate; and forming the mold comprising the holes by patterning the photoresist layer through a photolithography process.

10. The method of fabricating an optical structure of claim 7, wherein the mold comprises a spin-on-glass (SOG) material.

11. The method of fabricating an optical structure of claim 10, wherein the forming of the mold comprises:

sequentially forming a spin-on-glass (SOG) material layer and a photoresist layer on the substrate;

patterning the photoresist layer through a photolithography process; and forming the mold comprising the holes by etching the SOG material layer using the patterned photoresist layer as an etching mask.

12. The method of fabricating an optical structure of claim 4, wherein the substrate comprises an image sensor wafer and a spacer layer provided on the image sensor wafer.

13. The method of fabricating an optical structure of claim 12, wherein the spacer layer comprises at least one of a spin-on-glass (SOG) material and a low temperature oxide (LTO).

* * * * *